(12) United States Patent
Wimmer et al.

(10) Patent No.: US 11,782,855 B2
(45) Date of Patent: Oct. 10, 2023

(54) CONFIGURABLE TERMINATION CIRCUITRY

(71) Applicant: Micron Technology, Inc., Boise, ID (US)

(72) Inventors: Robert Wimmer, Hastings, MN (US); Taylor Loftsgaarden, Eden Prairie, MN (US); Ming-ta Hsieh, Woodbury, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/674,333

(22) Filed: Feb. 17, 2022

(65) Prior Publication Data

US 2022/0171723 A1 Jun. 2, 2022

Related U.S. Application Data

(63) Continuation of application No. 17/150,125, filed on Jan. 15, 2021, now Pat. No. 11,256,636, which is a continuation of application No. 16/720,157, filed on Dec. 19, 2019, now Pat. No. 10,896,143.

(51) Int. Cl.
  *G06F 13/16* (2006.01)
  *G11C 29/02* (2006.01)
  *G06F 13/40* (2006.01)
  *H03K 19/0185* (2006.01)

(52) U.S. Cl.
  CPC ...... *G06F 13/1694* (2013.01); *G06F 13/4086* (2013.01); *G11C 29/022* (2013.01); *H03K 19/018507* (2013.01); *H03K 19/018585* (2013.01)

(58) Field of Classification Search
None
See application file for complete search history.

(56) References Cited

U.S. PATENT DOCUMENTS

| 6,356,106 | B1 | 3/2002 | Greet |
| 10,325,635 | B2 | 6/2019 | Grunzke |
| 2003/0099138 | A1 | 5/2003 | Kyung |
| 2008/0079457 | A1 | 4/2008 | Yuan |
| 2009/0002018 | A1 | 1/2009 | Jeong |
| 2011/0016266 | A1 | 1/2011 | Shigehiro |
| 2011/0109344 | A1 | 5/2011 | Choi |
| 2011/0291698 | A1* | 12/2011 | Ko ............ H03K 19/017581 326/30 |

OTHER PUBLICATIONS

International Search Report and Written Opinion from related international application No. PCT/US2020/062121, dated Mar. 15, 2021, 9 pages.

* cited by examiner

*Primary Examiner* — Jany Richardson
(74) *Attorney, Agent, or Firm* — Brooks, Cameron & Huebsch, PLLC

(57) ABSTRACT

A resistance of configurable termination circuitry located at an interface between a memory component and a processing device is adjusted. The configurable termination circuitry includes a plurality of transistors, a plurality of switches coupled to the plurality of transistors, and a plurality of resistors coupled to the plurality of switches. The resistance of the configurable termination circuitry is adjusted based on a mode of the configurable termination circuitry.

18 Claims, 5 Drawing Sheets

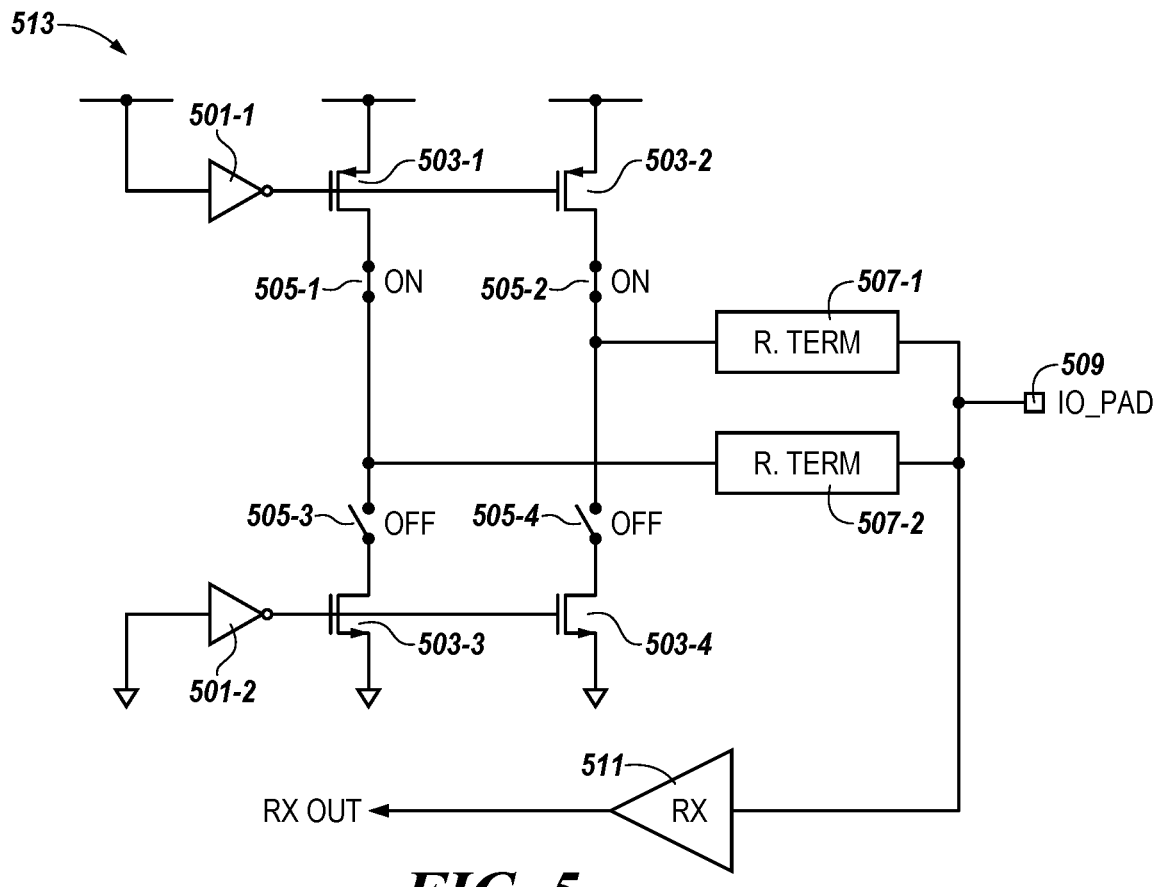

ADJUSTING A RESISTANCE OF CONFIGURABLE TERMINATION CIRCUITRY LOCATED AT AN INTERFACE BETWEEN A MEMORY COMPONENT AND A PROCESSING DEVICE BY SELECTING A MODE OF THE CONFIGURABLE TERMINATION CIRCUITRY AND TURNING A PLURALITY OF SWITCHES OF THE CONFIGURABLE TERMINATION CIRCUITRY ON OR OFF BASED ON THE SELECTED MODE OF THE CONFIGURABLE TERMINATION CIRCUITRY —614

DIRECTING CURRENT RECEIVED BY THE CONFIGURABLE TERMINATION CIRCUITRY BASED ON THE ADJUSTED RESISTANCE OF THE CONFIGURABLE TERMINATION CIRCUITRY —616

*FIG. 6*

CONFIGURABLE TERMINATION CIRCUITRY

PRIORITY INFORMATION

This application is a Continuation of U.S. application Ser. No. 17/150,125, filed on Jan. 15, 2021, which is a Continuation of U.S. application Ser. No. 16/720,157, filed on Dec. 19, 2019, issued as U.S. Pat. No. 10,896,143 on Jan. 19, 2021, the contents of which are incorporated herein by reference.

TECHNICAL FIELD

Embodiments of the disclosure relate generally to a memory sub-system, and more specifically, relate to configurable termination circuitry.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 illustrates another example of configurable termination circuitry in accordance with some embodiments of the present disclosure FIG. 6 is a flow diagram of an example method of operating configurable termination circuitry in accordance with some embodiments of the present disclosure.

DETAILED DESCRIPTION

Figure 1:
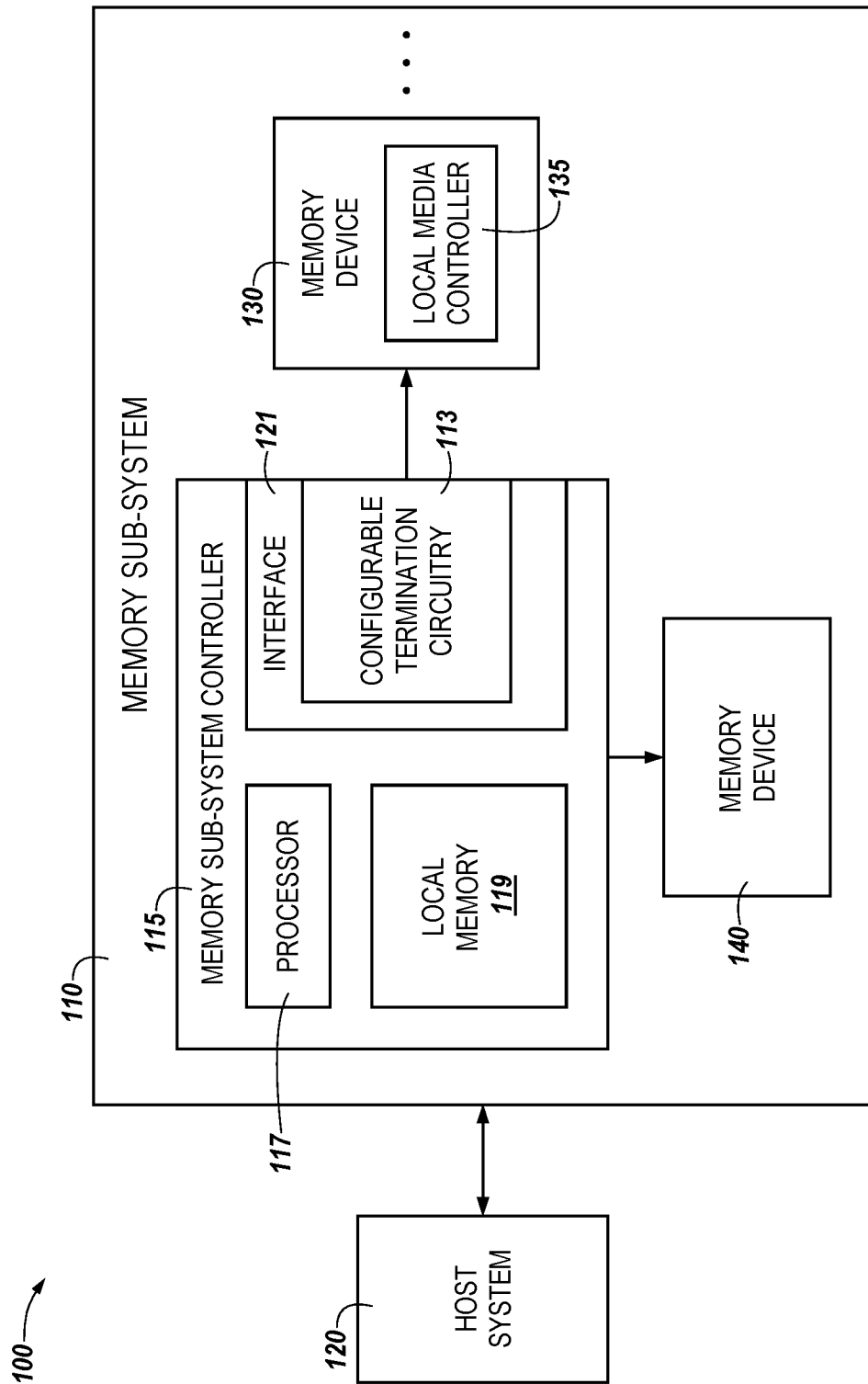
FIG. 1 illustrates an example computing system that includes a memory sub-system in accordance with some embodiments of the present disclosure.

Aspects of the present disclosure are directed to configurable termination circuitry in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

When a signal, such as a video or control signal, travels along a wire in a transmission line, such as a bus, the signal can be reflected within the bus. The signal can reflect due to a variety of factors, such as discontinuities in the wire. For example, when a signal reaches the end of the line where the wire ends, if the wire is just cut off, the signal can hit the end of the line and reflect straight back. This reflection can cause a variety of problems, such as degrading the signal, and/or returning an extra (e.g., erroneous) signal.

In conventional memory sub-systems, termination circuitry configured in either transmit mode or receive mode may be added to one or both ends of the transmission line to prevent the signal from reflecting off of the ends of the transmission line. However, the transmit mode termination circuitry may be configured on a separate circuit than the receive mode termination circuitry, which may decrease the performance of the memory sub-system. For example, having separate circuits for the transmit and receive mode termination circuitry can increase the area of the termination circuitry, which leaves less space to add other components in the memory sub-system, further, the separate circuits can increase the parasitic capacitance within the memory sub-system.

Aspects of the present disclosure address the above and other deficiencies by forming configurable termination circuitry in a memory sub-system. The configurable termination circuitry can combine receive mode termination and transmit mode termination into a single circuit. Combining transmit mode termination and receive mode termination into one circuit can provide a variety of benefits to the memory sub-system, such as occupying less space within the memory device and decreasing the parasitic capacitance within the memory sub-system.

One benefit of combining receive mode and transmit mode circuitry is that it occupies less space within a memory sub-system than having two separate circuits for receive mode and transmit mode termination. Forming termination circuitry that occupies less space in a memory sub-system can create more space to incorporate additional elements into the memory sub-system. For example, the additional space resulting from combining receive mode and transmit mode termination circuitry may create more space to add processors, controllers, and various other memory device components. Adding additional memory sub-system components can provide benefits to a memory sub-system that include, but are not limited to, increased functionality and increased performance in the memory sub-system.

Another benefit of combining receive mode and transmit mode termination circuitry is that the combined circuitry can decrease parasitic capacitance within a memory sub-system. As used herein, "parasitic capacitance" can refer to a capacitance that exists between parts of an electronic component or circuit because of their proximity to each other. Parasitic capacitance can occur because two parts have different electric potentials and create an electric field which causes them to store an electric charge. Parasitic capacitance can cause a variety of negative effects within a memory sub-system including, but not limited to, reducing signal bandwidth and increasing noise injection to other signals or the power and ground supplies.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, the term "coupled to" or "coupled with" can refer to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via an interface (e.g., a physical host interface) 121. Examples of an interface 121 can include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), Universal Serial Bus (USB), or any other interface. The interface 121 can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The interface 121 can provide a way for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type memory (e.g., 2D NAND, 3D NAND) are described, the memory device 130 can be based on any other type of non-volatile memory or storage device, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface (not pictured) circuitry to communicate with the host system 120 via a physical host interface (not pictured). The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes termination circuitry 113 that can be configured to operate in different modes, such as transmit mode and/or receive mode. The termination circuitry 113 can be located at an interface 121 between the memory sub-system controller 115 and the memory device 130, and can be used to prevent reflection of signals being communicated between controller 115 and memory device 130 by reducing signals to or from memory device 130 at the interface.

For example, one end of a bus can be connected to the memory sub-system controller 115 and the other end of the bus can be connected to the memory device 130 to couple the memory sub-system controller 115 to the memory device 130. In some embodiments, the bus can be one or more connectors above coupled via one or more wires.

The termination circuitry 113 can be located at interface 121. In some embodiments, as shown in FIG. 1, the interface 121 with termination circuitry 113 can be located on a memory sub-system controller 115. In other embodiments (not pictured), the interface 121 with the termination circuitry can be located on memory device 130. In some embodiments (e.g., embodiments in which interface 121 is located on a controller 115), the termination circuitry 113 can be coupled to an output of an input/output (TO) bus at the interface 121, and in some embodiments (e.g., embodiments in which interface 121 is located on memory device 130), the termination circuitry 113 can be coupled to an input of an IO bus at the interface 121. As used herein, the term "input/output bus" can refer to a communication system that allows different components of memory sub-systems to communicate with each other.

The termination circuitry 113 can reduce signals to or from memory device 130 at the interface 121 at which the termination circuitry is located based on the mode of the configurable termination circuitry. In some embodiments, a processing device (e.g., processor 117) can adjust the resistance of the configurable termination circuitry 113 based on the mode of the configurable termination circuitry (e.g., based on whether the termination circuitry is configured to operate in transmit mode or receive mode). For example, the configurable termination circuitry 113 can include a plurality of transistors, a plurality of switches coupled to the plurality of transistors, and a plurality of resistors coupled to the plurality of switches, and the processing device can adjust the resistance of the configurable termination circuitry by turning one or more of the plurality of switches on or off. Examples of the termination circuitry, the different modes in which the termination circuitry can be configured, and the adjustment of the resistance of the termination circuitry will be further described herein.

In some embodiments, the interface 121, with the termination circuitry 113 can be located on both the memory sub-system controller 115 and the memory device 130. For example, if the memory sub-system controller 115 is coupled to the memory device 130 via a bi-directional bus, having termination circuitry 113 at both ends of the bus can allow the termination circuitry 113 to reduce (e.g., terminate) signals traveling in both directions of the bi-directional bus.

The configurable termination circuitry 113 can be backwards compatible. As used herein, the term "backwards compatible" refers to an electrical component that can satisfy all the requirements of the current standards of the electrical component as well as the requirements of previous standards of the electrical component. Therefore, the termination circuitry 113 can couple to electrical components adhering to current standards as well as previous standards.

Figure 2:
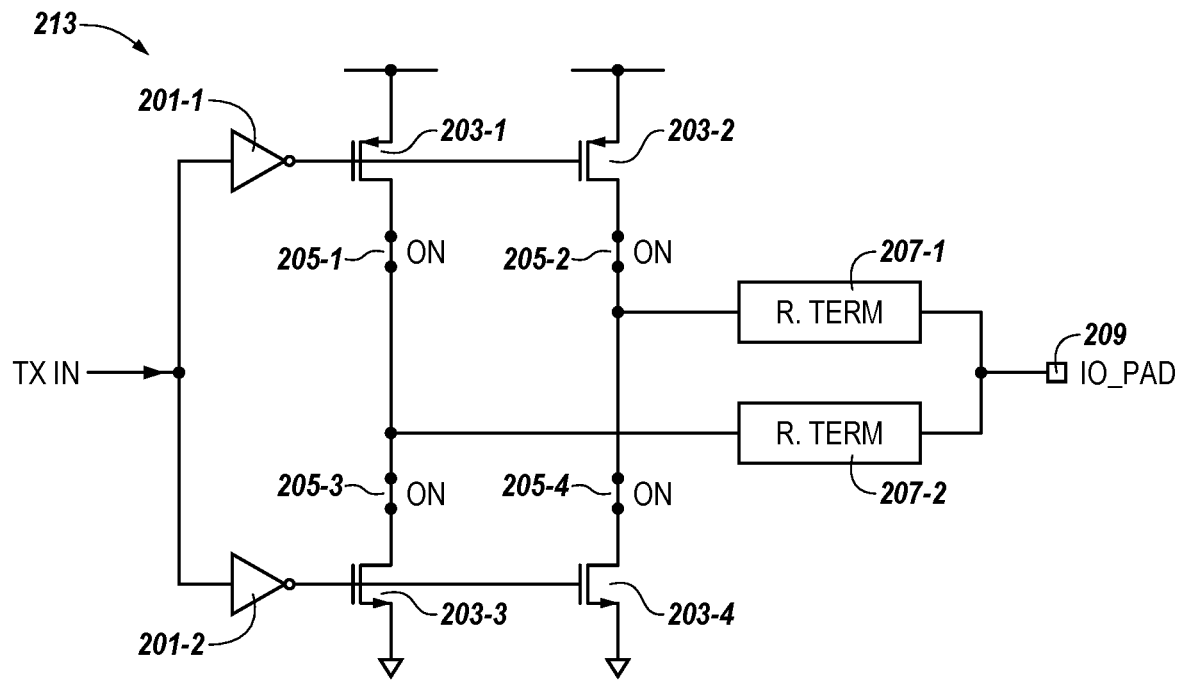
FIG. 2 illustrates an example of configurable termination circuitry in accordance with some embodiments of the present disclosure.

FIG. 2 illustrates an example of configurable termination circuitry 213 in accordance with some embodiments of the present disclosure. The termination circuitry 213 can include logic circuitry 201-1, 201-2 (individually or collectively referred to as logic circuitry 201), transistors 203-1, 203-2, 203-3, 203-4 (individually or collectively referred to as transistors 203) coupled to logic circuitry 210, switches 205-1, 205-2, 205-3, 205-4 (individually or collectively referred to as switches 205) coupled to transistors 203, resistors 207-1, 207-2 (individually or collectively referred to as resistors 207) coupled to the switches 205, and an input/output (TO) pad 209. Further, the switches 205-3 and 205-4, and transistors 203-3 and 203-4, can be coupled to ground. Further, the switches 205-1 and 205-2, and transistors 203-1 and 203-2 can be coupled to source.

In the example shown in FIG. 2, the termination circuitry 213 can be configured in transmit mode. As used herein, the term "transmit mode" can refer to a configuration of termination circuitry wherein the termination circuitry is configured to drive a signal onto a transmission medium. As used herein, the term "transmission medium" can refer to an object used to transmit signals from one memory device component to a different memory device component. For example, a transmission medium can be one or more wires coupled to an interface (e.g., interface 121 shown in FIG. 1). In the example shown in FIG. 2, the termination circuitry 213 can be configured in transmit mode by turning all of the switches 205 on.

The termination circuitry 213 can receive one or more signals from a controller (e.g., memory sub-system controller 115) or other electrical component via logic circuitry 201. The one or more signals can travel through the termination circuitry 213 to an IO pad 209. As used herein, the term "input/output pad" can refer to intermediate structures connecting internal signals from a memory device component to a transmission medium. The one or more signals can travel through the termination resistor 207-1 because the switches 205-2, 205-4 are turned on, and the one or more signals can also travel through the termination resistor 207-2 because the switches 205-1 and 205-3 are turned on. In transmit mode, the resistors 207 can provide a source termination for a transmission medium and set an amplitude of the signal transmitted into the transmission medium. As used herein, the term "source termination" can refer to placing a resistor in series with a driver wherein the source resistance is equal to the impedance of a transmission medium.

Figure 3:
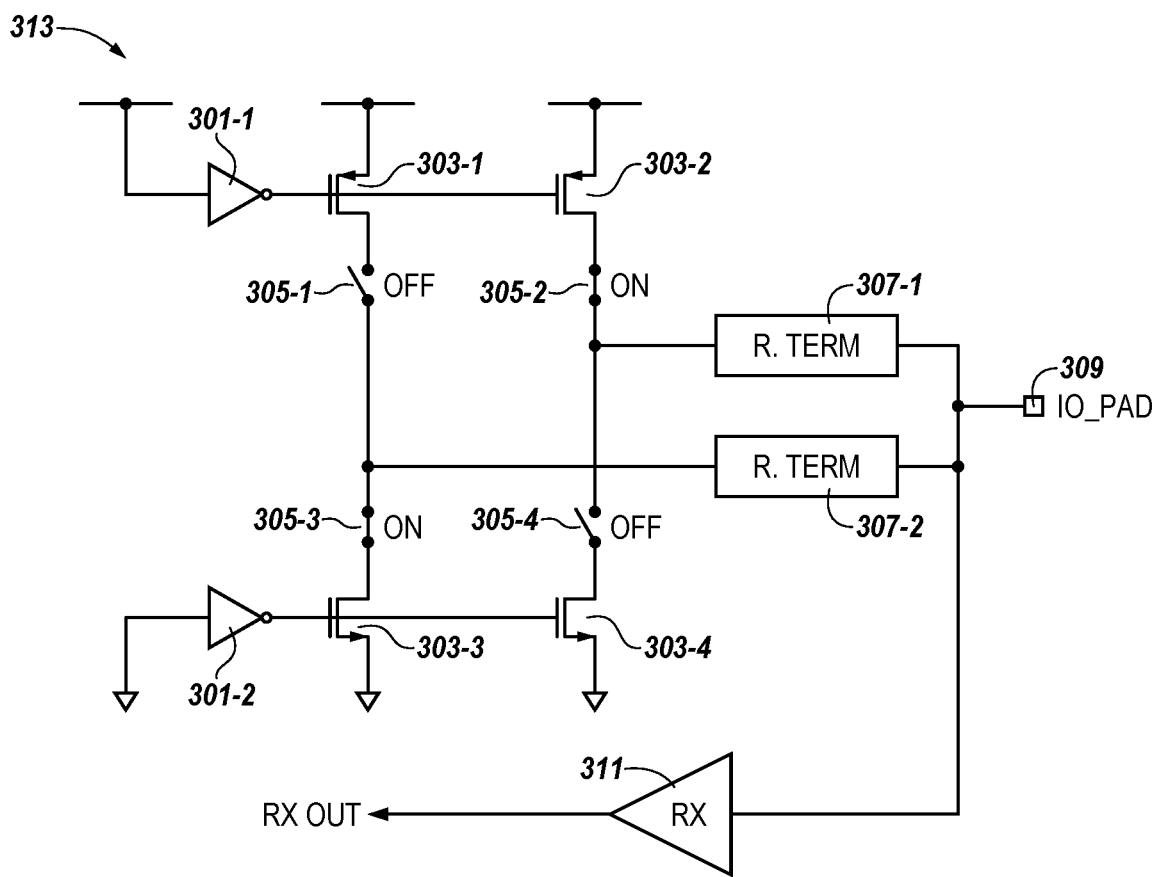
FIG. 3 illustrates another example of configurable termination circuitry in accordance with some embodiments of the present disclosure.

FIG. 3 illustrates another example of configurable termination circuitry 313 in accordance with some embodiments of the present disclosure. The termination circuitry 313 can include logic circuitry 301-1, 301-2 (individually or collectively referred to as logic circuitry 301), transistors 303-1, 303-2, 303-3, 303-4 (individually or collectively referred to as transistors 303) coupled to logic circuitry 301, switches 305-1, 305-2, 305-3, 305-4 (individually or collectively referred to as switches 305) coupled to transistors 303, resistors 307-1, 307-2 (individually or collectively referred to as resistors 307) coupled to switches 305, an IO pad 309 and the receiver circuitry 311, coupled to resistors 307. Further, switches 305-3 and 305-4, and transistors 303-3 and 303-4, and logic circuitry 301-2, can be coupled to ground. Further, the switches 305-1 and 305-2, and transistors 303-1 and 303-2 can be coupled to source.

In the example shown in FIG. 3, termination circuitry 313 can be configured to be in receive mode. As used herein, the term "receive mode" can refer to a configuration of termination circuitry wherein the termination circuitry is configured to terminate one or more signals exiting a transmission medium. While in receive mode, the termination circuitry 313 can be configured in a variety of sub-modes including, but not limited to, center-tap termination, ground termination, and supply termination. As used herein, the term "sub-mode" can refer to a mode in which the termination circuitry can be configured when the termination circuitry is configured in a specified mode.

In the example shown in FIG. 3, termination circuitry 313 can be configured for center-tap termination. In some embodiments, in center-tapped circuitry, one or more switches 305 can be turned on and one or more switches 305 can be turned off. For example, as shown in FIG. 3, switches 305-1 and 305-4 can be turned off and switches 305-2 and 305-3 can be turned on to configure termination circuitry 313 for center-tap termination.

The termination circuitry 313 can receive one or more signals from a different memory device component. For example, if termination circuitry 313 is located on a memory device (e.g., memory device 130 shown in FIG. 1), the termination circuitry 313 can receive one or more signals from a controller (e.g., memory sub-system controller 115). The termination circuitry 313 can receive the one or more signals through the IO pad 309. Once the one or more signals are received from the IO pad 309, the one or more signals can travel to the receiver circuitry 311. As used herein, the term "receiver circuitry" can refer to circuitry that captures a signal from a transmission medium. In the receive mode configuration, the termination resistors 307 can provide an impedance to minimize reflections of incident signals from the transmission medium. As used herein, the term "incident signal" can refer to a signal that travels through a transmission medium from a source to a load. A signal can become incident when it arrives at a discontinuity or another transmission medium with different propagation characteristics that affect how a signal travels through the transmission medium.

The termination circuitry 313 can receive one or more signals via the IO pad 309. The one or more signals may travel to the receiver circuitry 311. At least one of the signals can reflect back towards the other elements of the termination circuitry 313. The reflected signal can travel through the termination resistors 307. As stated above, the switches 305-1, 305-4 can be turned off and the switches 305-2, 305-3 can be turned on. Therefore, an incident signal can travel through the termination resistor 307-1 to source and/or termination resistor 307-2 to ground. This can reduce the current of a reflected signal and reduce the negative effects of the reflected signal on a memory device.

Manipulating an input current using termination circuitry 313, as described herein, can reduce reflections in a transmission medium by matching or modifying the impedance incident to the IO pad 309. For example, the termination resistors 307 can restrict the flow of the one or more signals. By restricting the flow of the one or more signals, the termination resistors 307 can reduce the reflection of the signals within the transmission medium, which can increase the performance of the memory sub-system.

As stated above, one or more signals can travel through the receiver circuitry 311. Once the one or more signals travels through the receiver circuitry 311, the one or more signals can travel to a memory sub-system component. In some embodiments, the signals may be instructions sent from a controller to a memory device. For example, the signals can be sent from a controller (e.g., memory sub-system controller 115 shown in FIG. 1) to a memory device (e.g., memory device 130 shown in FIG. 1). If the termination circuitry 313 is located on an interface (e.g., interface 121-2) of a memory device, the signal may travel through the termination circuitry 313 and travel through the receiver circuitry 311 to the memory device.

Figure 4:
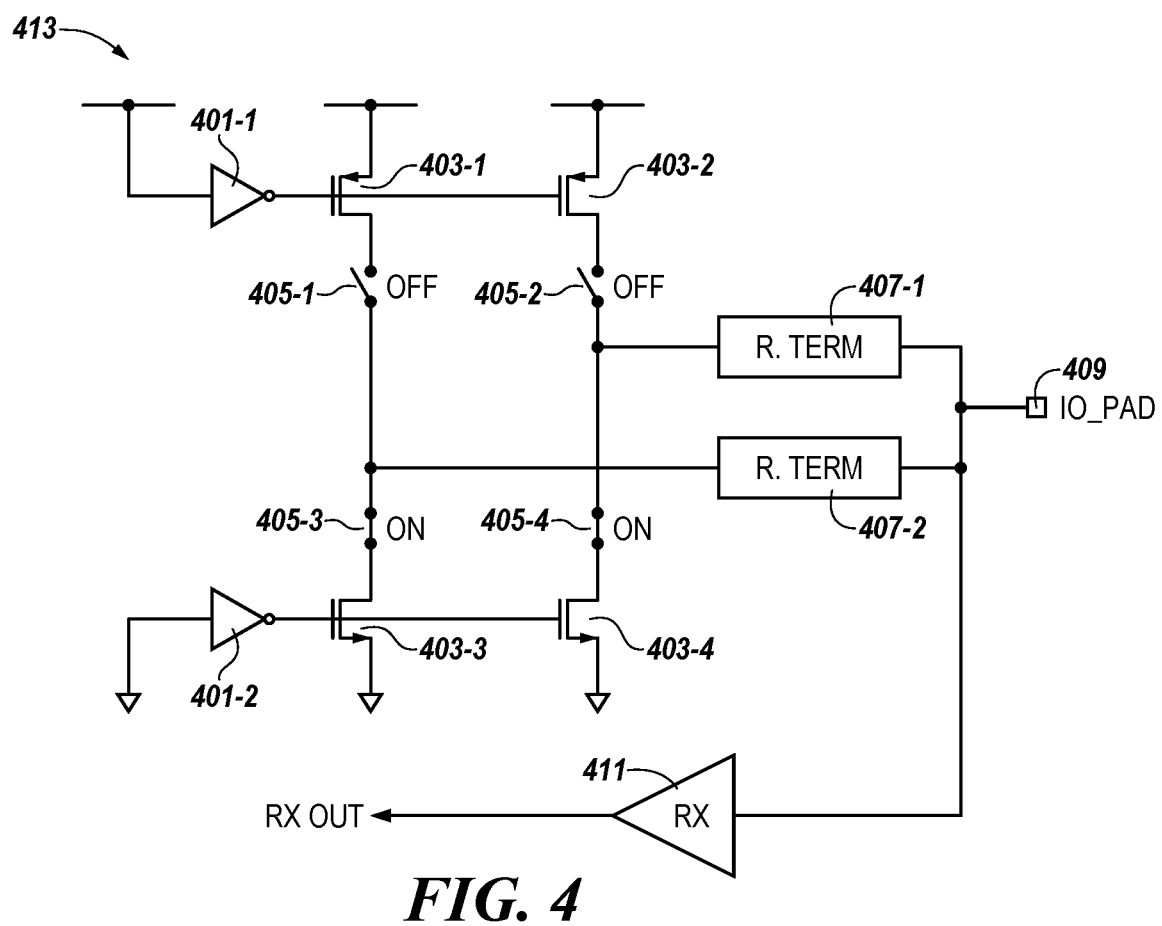
FIG. 4 illustrates another example of configurable termination circuitry in accordance with some embodiments of the present disclosure.

FIG. 4 illustrates another example of configurable termination circuitry in accordance with some embodiments of the present disclosure. The termination circuitry 413 can include logic circuitry 401-1, 401-2 (individually or collectively referred to as logic circuitry 401), transistors 403-1, 403-2, 403-3, 403-4 (individually or collectively referred to as transistors 403) coupled to the logic circuitry 401, switches 405-1, 405-2, 405-3, 405-4 (individually or collectively referred to as switches 405) coupled to the transistors 403, resistors 407-1, 407-2 (individually or collectively referred to as resistors 407) coupled to the switches 405, an IO pad 409 and a receiver circuitry 411. Further, the switches 405-3 and 405-4, and the transistors 403-3 and 403-4, can be coupled to ground. Further, the switches 405-1 and 405-2, and transistors 403-1 and 403-2 can be coupled to source.

In the example shown in FIG. 4, termination circuitry 413 can be configured to be in receive mode. While in receive mode, the termination circuitry 413 can be configured in a variety of sub-modes. In the example shown in FIG. 4, the termination circuitry 413 is similar to termination circuitry 313, however, the termination circuitry 413 can be configured for ground termination.

The termination circuitry 413 can be configured for ground termination because the circuit can be configured to terminate incident signals to ground. As shown in FIG. 4, to configure termination circuitry 413 for ground termination, switches 405-1, 405-2 can be turned off and switches 405-3, 405-4 can be turned on. Further, the two switches 405-3, 405-4 that are turned on can be coupled to (e.g., lead to) ground.

The termination circuitry 413 can receive one or more signals via the IO pad 409. The one or more signals may travel to the receiver circuitry 411. At least one of the signals can reflect back towards the other elements of the termination circuitry 413. The reflected signal can travel through the termination resistors 407. As stated above, the switches 405-1, 405-2 can be turned off and the switches 405-3, 405-4 can be turned on. Therefore, an incident signal can travel through the termination resistors 407 to ground. This can reduce the current of a reflected signal and reduce the negative effects of the reflected signal on a memory device.

FIG. 5 illustrates another example of termination circuitry in accordance with some embodiments of the present disclosure. The termination circuitry 513 can include logic circuitry 501-1, 501-2 (individually or collectively referred to as logic circuitry 501), transistors 503-1, 503-2, 503-3, 503-4 (individually or collectively referred to as transistors 503) coupled to logic circuitry 501, switches 505-1, 505-2, 505-3, 505-4 (individually or collectively referred to as switches 505) coupled to transistors 503, resistors 507-1, 507-2 (individually or collectively referred to as resistors 507) coupled to switches 505, an IO pad 509 and a receiver circuitry 511. Further, switches 505-3 and 505-4, and transistors 503-3 and 503-4, can be coupled to ground. Further, the switches 505-1 and 505-2, and transistors 503-1 and 503-2 can be coupled to source.

In the example shown in FIG. 5, termination circuitry 513 can be configured to be in receive mode. While in receive mode, the termination circuitry 513 can be configured in a variety of sub-modes. In the example shown in FIG. 5, the termination circuitry 513 can be similar to the termination circuitry 313, however, the termination circuitry 513 can be configured for supply termination.

The termination circuitry 513 can be configured for supply termination because the circuitry can be configured to terminate incident signals to supply. As shown in FIG. 5, to configure the termination circuitry 513 for supply termination, switches 505-1, 505-2 can be turned on and switches 505-3, 505-4 can be turned off. Further, the switches 505-1, 505-2 that are turned on can be coupled to (e.g., lead to) supply.

The termination circuitry 513 can receive one or more signals via the IO pad 509. The one or more signals can travel to the receiver circuitry 511. One or more of the signals can reflect back towards the other elements of the termination circuitry 513. The reflected signal can travel through the termination resistors 507. As stated above, the switches 505-1, 505-2 can be turned on and the switches 505-3, 505-4 can be turned off. Therefore, an incident signal can travel through the termination resistor 507 to supply. This can reduce the current of a reflected signal and reduce the negative effects of the reflected signal on a memory device.

FIG. 6 is a flow diagram of an example method 612 for operating configurable termination circuitry in accordance with a number of embodiments of the present disclosure. The method 612 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 612 is performed by the configurable termination circuitry 113 of FIG. 1, the configurable termination circuitry 213 of FIG. 2, the configurable termination circuitry 313 of FIG. 3, and/or the configurable termination circuitry 413 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 614, the method 612 includes adjusting a resistance of configurable termination circuitry located at an interface between a memory component and a processing device by selecting a mode of the configurable termination circuitry and turning a plurality of switches of the configurable termination circuitry on or off based on the selected mode of the configurable termination circuitry. As stated above, termination circuitry (e.g., termination circuitry 113 shown in FIG. 1) can be configured in a variety of modes. For example, the termination circuitry can be configured in either receive mode or transmit mode. If the termination circuitry is configured in receive mode, the termination circuitry can be configured in a variety of sub-modes. In some embodiments, these sub-modes can include, but are not limited to, center termination, ground termination, and supply termination.

Further, as stated above, the termination circuitry can include one or more switches and termination resistors. The mode in which the configurable termination circuitry is configured can be determined, in part, by the configuration of the switches. For example, if all of the switches of the configurable termination circuit are turned on, the configurable termination circuit can be in transmit mode. If multiple switches are turned on and multiple switches are turned off, the configurable termination circuitry can be in receive mode.

Further, as stated above, the sub-mode in which the configurable termination circuitry is configured can be determined, in part, by which of the switches is turned on and which of the switches is turned off. For example, if the two of the one or more switches turned on are coupled to ground, the sub-mode of the configurable termination circuitry can be ground termination mode. If the two of the one or more switches turned on are coupled to supply, the mode of the configurable termination circuitry can be in supply termination mode. Further, if one of the one or more switches coupled to ground is turned on while one of the one or more switches coupled to supply is turned on, the mode of the configurable termination circuitry can be center termination mode.

At block 616, the method 612 includes directing current received by the configurable termination circuitry based on the adjusted resistance of the configurable termination circuitry. The configuration of the switches can direct the flow of a signal traveling through the termination circuitry, as stated above. For example, as shown in FIG. 5, turning the switch 505-1 on can direct a signal through the termination resistor 507-2 and turning the switch 505-2 on can direct a signal through the termination resistor 507-1. In some embodiments, the termination circuitry can reduce multiple output signals of an IO bus at an interface (e.g., interface 121 shown in FIG. 1) between a memory component and a processing device by directing the signal (e.g., current).

Turning certain switches on or off can also adjust the resistance of the termination circuitry. For example, if a switch coupled to a resistor is turned on, it can complete a circuit and allow current to flow through that resistor. Alternatively, if a switch coupled to a resistor is turned off, it can result in an incomplete circuit and prevent current from flowing through that resistor. The resistance of termination circuitry can be determined by the total resistance of the resistors coupled to the termination circuitry. Configurable resistance values can be accomplished by configuring termination resistors (e.g. termination resistors 207 shown in FIG. 2) in parallel and configuring the termination resistors to be enabled or disabled.

Figure 7:
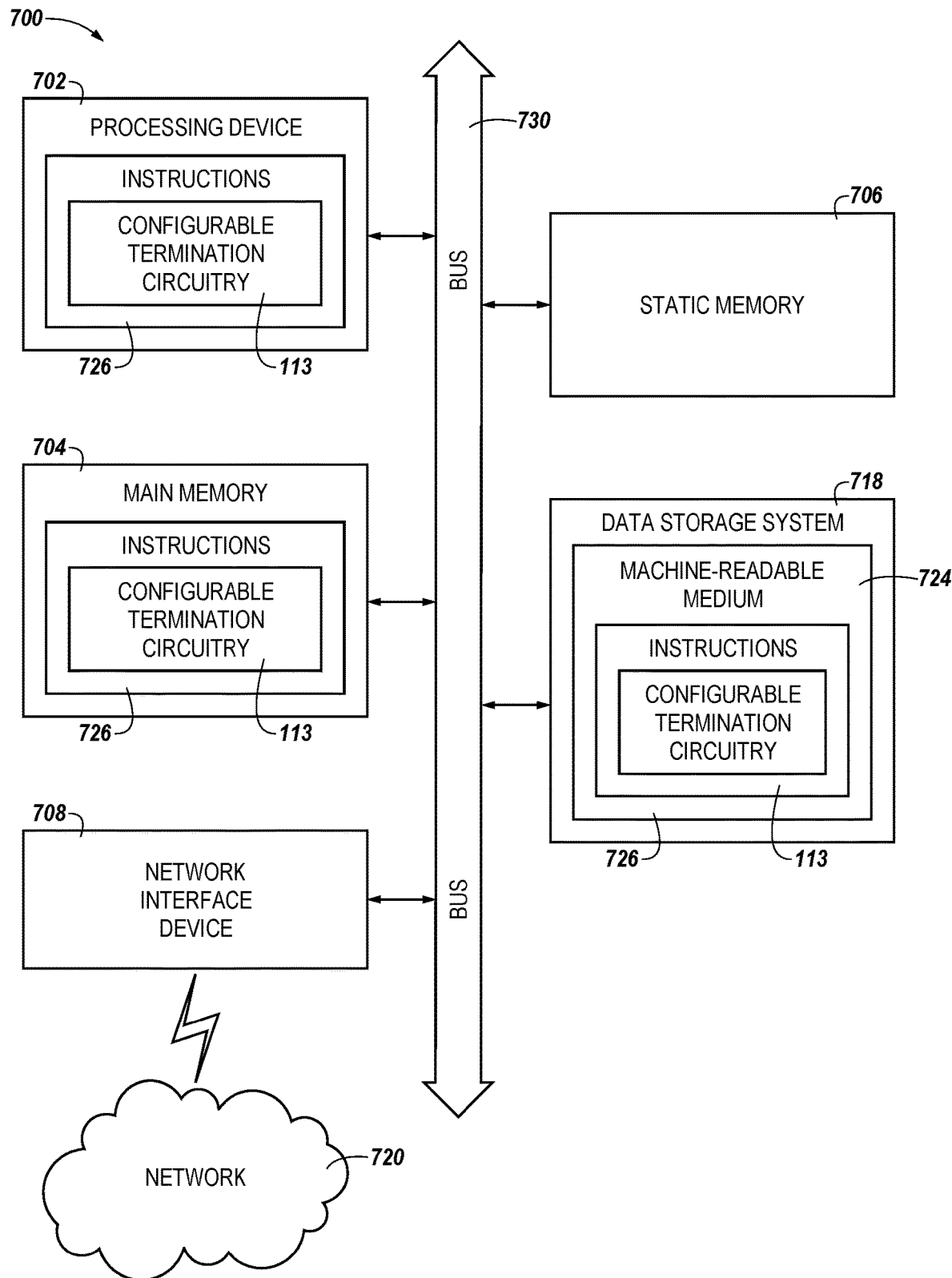
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the configurable termination circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to configurable termination circuitry (e.g., the configurable termination circuitry 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

The present disclosure includes devices, methods, and systems supporting configurable termination circuitry. A number of embodiments include configurations of configurable termination circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    configurable termination circuitry, wherein:
        the configurable termination circuitry includes a plurality of transistors coupled to a plurality of switches;
        the configurable termination circuitry includes a plurality of resistors coupled to the plurality of switches; and
        a first resistor of the plurality of resistors is coupled to two switches of the plurality of switches and a second resistor of the plurality of resistors is coupled to two different switches of the plurality of switches;
        the configurable termination circuitry is configured in one of a plurality of sub-modes when the configurable termination circuitry is in receive mode; and
        the plurality of sub-modes includes a center-tap termination mode, a ground termination mode, and a supply termination mode; and
    a processing device to adjust a resistance of the configurable termination circuitry.

2. The apparatus of claim 1, wherein the processing device is to adjust the resistance of the configurable termination circuitry based on a mode of the configurable termination circuitry.

3. The apparatus of claim 1, wherein the processing device is to adjust the resistance of the configurable termination circuitry by turning two of the plurality of switches on and turning two of the plurality of switches off.

4. The apparatus of claim 1, wherein the first resistor and the second resistor are each coupled to at least one transistor of the plurality of transistors and an input/output (I/O) pad.

5. The apparatus of claim 1, wherein the first resistor and the second resistor are coupled to different transistors of the plurality of transistors.

6. An apparatus, comprising:
    configurable termination circuitry having a plurality of switches, wherein:
        the configurable termination circuitry is to reduce a plurality of signals to or from circuitry outside of the configurable termination circuitry based on a mode of the configurable termination circuitry;
        the mode of the configurable termination circuitry is a transmit mode when all of the plurality of switches are turned on;
        the configurable termination circuitry is configured in one of a plurality of sub-modes when the configurable termination circuitry is in receive mode; and
        the plurality of sub-modes includes a center-tap termination mode, a ground termination mode, and a supply termination mode.

7. The apparatus of claim 6, wherein the configurable termination circuitry is to provide source termination for a transmission medium when the configurable termination circuitry is in the transmit mode.

8. The apparatus of claim 6, wherein the configurable termination circuitry is to set an amplitude of a signal transmitted into a transmission medium.

9. The apparatus of claim 6, wherein the configurable termination circuitry is to terminate signals exiting a transmission medium.

10. The apparatus of claim 6, wherein a first group of the plurality of switches are turned on and a second group of the plurality of switches are turned off when the configurable termination circuitry is configured in the ground termination mode.

11. The apparatus of claim 6, wherein the configurable termination circuitry is to terminate the plurality of signals to ground when the configurable termination circuitry is configured in the ground termination mode.

12. The apparatus of claim 6, wherein a signal of the plurality of signals travels through a resistor to source when the configurable termination circuitry is configured in the center-tap termination mode.

13. The apparatus of claim 6, wherein a signal of the plurality of signals travels through a resistor to ground when the configurable termination circuitry is configured in the center-tap mode.

14. The apparatus of claim 6, wherein a signal of the plurality of signals travels through a first resistor to ground via a transistor coupled to ground or through a second resistor to ground via a different transistor coupled to ground when the configurable termination circuitry is configured in the ground termination mode.

15. The apparatus of claim 6, wherein a signal of the plurality of signals travels through a first resistor to source via a transistor coupled to source or through a second resistor to source via a different transistor coupled to source when the configurable termination circuitry is configured in the supply termination mode.

16. A method, comprising:
    adjusting a resistance of configurable termination circuitry by:
        selecting a mode of the configurable termination circuitry; and
        turning a plurality of switches of the configurable termination circuitry on or off based on the selected mode of the configurable termination circuitry, wherein:
            the mode of the configurable termination circuitry is a transmit mode when all of the plurality of switches are turned on;
            the configurable termination circuitry is configured in one of a plurality of sub-modes when the configurable termination circuitry is in receive mode; and
            the plurality of sub-modes includes a center-tap termination mode, a ground termination mode, and a supply termination mode.

17. The method of claim 16, further comprising restricting, by at least one of a plurality of resistors coupled to the plurality of switches, a flow of a signal received from an I/O pad coupled to the plurality of resistors.

18. The method of claim 17, wherein the flow of the signal received from the I/O pad is restricted after the signal is reflected off of receiver circuitry coupled to the I/O pad when the mode of the configurable termination circuitry is a receiver mode.

* * * * *